United States Patent [19]

Esaki et al.

[11] Patent Number: 4,665,415
[45] Date of Patent: May 12, 1987

[54] SEMICONDUCTOR DEVICE WITH HOLE CONDUCTION VIA STRAINED LATTICE

[75] Inventors: Leo Esaki, Katonah; Leroy L. Chang, Goldens Bridge; Wen-I Wang, Putnam Valley, all of N.Y.

[73] Assignee: International Business Machines Corporation, Armonk, N.Y.

[21] Appl. No.: 726,543

[22] Filed: Apr. 24, 1985

[51] Int. Cl.$^4$ ............................................. H01L 29/80
[52] U.S. Cl. ...................................... 357/22; 357/16; 357/4; 357/23.1
[58] Field of Search ....................... 357/22, 16, 4, 23.1

[56] References Cited

U.S. PATENT DOCUMENTS 4,538,165  9/1985  Chang et al. ........................... 357/22

OTHER PUBLICATIONS

Applied Physics Letters, vol. 44, No. 1, Jan. 1, 1984, pp. 139-141, Stormer et al., "Temperature Dependence of the Mobility of Two-Dimensional Hole Systems in Modulation Doped GaAs—(AlGa) As".
Applied Physics Letters, vol. 36, No. 8, Apr. 15, 1980, pp. 685-687, Stormer et al., "Two-Dimensional Hole Gas at a Semiconductor Heterojunction Interface".
Journal of Applied Physics, vol. 48, No. 7, Jul. 1977, pp. 3018-3023, Van Der Ziel et al., "Absorption, Refractive Index and Birefringence of AlAs—GaAs monolayers".

Primary Examiner—Martin H. Edlow
Attorney, Agent, or Firm—Perman & Green

[57] ABSTRACT

A field-effect transistor includes a conduction channel between a source terminal and a drain terminal, which channel employs holes as the charge carriers. The conduction channel is disposed within a layer of material comprising a group III-V compound of the periodic table and having a crystalline lattice structure which is stressed in two dimensions by means of epitaxial growth upon a thicker and rigid supporting layer comprising a different group III-V compound having a larger lattice spacing. The layer having the conduction channel is relatively thin being on the order of a few electron wavelength in thickness. The stretching of the layer having the conduction channel shift the energy levels of holes therein to remove the degenerate state thereof, thereby elevating light holes to an energy level characterized by increased mobility.

12 Claims, 4 Drawing Figures

SEMICONDUCTOR DEVICE WITH HOLE CONDUCTION VIA STRAINED LATTICE

The government has rights in this invention pursuant to contract No. DAAG 29-81-C-0038 awarded by the U.S. Army Research Office.

DESCRIPTION

1. Technical Field

This invention relates to semiconductor devices such as a field-effect transistor (FET) and, more particularly, to a transistor structure with a strained epitaxial layer for increased hole mobility.

2. Prior Art

In the construction of semiconductor circuits, both n-type devices and p-type devices are employed, the former utilizing electrons as the charge carriers while the latter utilizes holes as the charge carriers. Complementary circuitry is advantageously employed in many situations, as in push-pull operations, or in circuitry employing n-p-n and p-n-p transistors formed as discrete components or formed within the chip of an integrated circuit. Today, a major interest is the construction of such circuits by large arrays of transistor devices within a single integrated circuit chip. A particular advantage of complementary circuitry and large scale arrays is the fact that the p-type and the n-type devices conduct alternately, thereby consuming less power so as to achieve high density circuits.

Semiconductive devices constructed from silicon with suitable doping to provide n-type and p-type regions have been successfully employed in the construction of arrays of complementary circuits. An important factor in the success of the silicon is the presence of good mobility for both holes and electrons. The mobilities are sufficiently comparable in value so as to provide similar circuit parameters for devices employing the electron conduction and for devices employing the hole construction. The silicon is disadvantageous in that the frequency response of devices constructed of the silicon is not as high as would be desired in many applications.

A higher frequency response can be obtained by use of semiconducting compounds of elements from groups III and V of the periodic table. Circuits constructed of such material do have the desired high frequency response.

However, a problem arises in the use of the foregoing group III-V semiconductor material in that the value of mobility for holes and electrons differ greatly. Essentially, only the electrons can be utilized as charge carriers. Therefore, complementary circuitry employing both p-type and n-type devices cannot be constructed as is done in the foregoing case of silicon. The problem is particularly acute in the case of construction of field-effect transistors of the group III-V compounds because such FET's are regularly used in a wide variety of electronic circuits.

SUMMARY OF THE INVENTION

The foregoing problem is overcome and other advantageous are provided by the construction of a p-type semiconductor device, particularly a field-effect transistor, by construction of a hole conduction channel and a layer of semiconductor material which is relatively thin, the thickness being on the order of a few electron wavelengths in the quantum mechanics model of the material. In accordance with the invention, the thin layer of material is grown by epitaxy on a relatively thick rigid layer of material having a crystalline lattice structure which differs from that of the material of the thin layer in that the lattice spacing of the thick layer is larger than the lattice spacing of the thin layer. The epitaxial layer is sufficiently thin such that the material is strained to conform with the lattice spacing of the rigid thick layer.

In the present case of the group III-V semiconductor compounds, such a straining of the material of the epitaxial layer gives rise to an elongation in two dimensions along the surface of the rigid thick layer and a compressive stress in a direction normal to the surface. This results in a shifting of the energy levels removing the degeneracy of heavy and light holes and making the lattice support charge carriers with substantial mobility.

As a further feature in the construction of semiconductor devices, particularly FET's, an additional layer of material is placed upon the strained layer, the additional layer serving as a component of the gate structure of an FET and as an energy confining layer so that the thin, strained layer is quantized. In addition, the further layer is selectively doped with impurities. The contiguous locations of the further doped layer and the strained layer permit the transfer of holes from the further layer to penetrate the strained layer to provide for an effect known as modulation doping wherein the hole mobility is enhanced without the infusion of impurities in the strained layer. Thereby, by virtue of the shifting of the hole energy levels and the modulation doping a p-type FET can be constructed with a hole mobility substantially equal to that of the electron mobility in a conventional n-type FET. This permits the construction of complementary FET circuitry from group III-V semiconductor material.

BRIEF DESCRIPTION OF THE DRAWINGS

The foregoing aspects and other features of the invention are explained in the following description taken in connection with the accompanying drawings wherein.

DETAILED DESCRIPTION OF THE PREFERRED EMBODIMENT OF THE INVENTION

Figure 1:
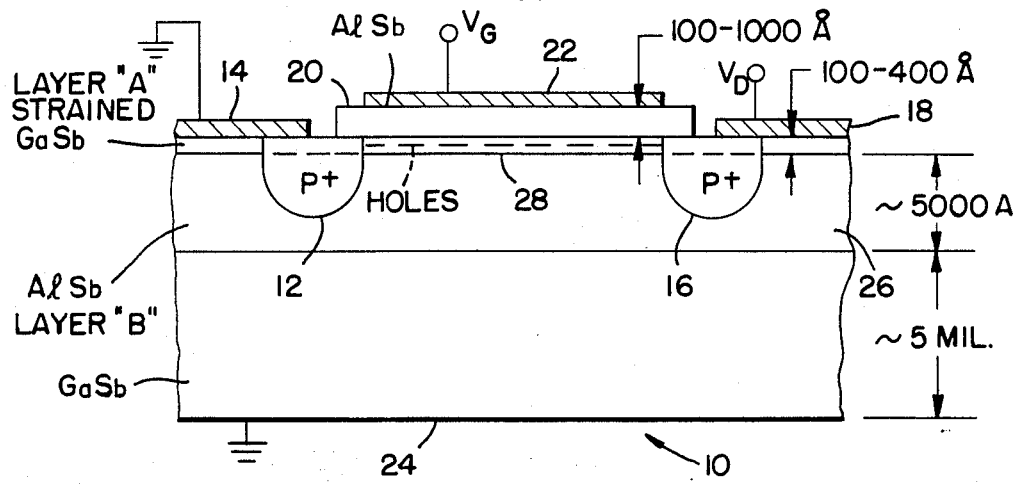
FIG. 1 is a diagrammatic view of a semiconductor device incorporating the invention.

FIG. 1 shows a semiconductor device incorporating the invention, the semiconductor device being structured as a field-effect transistor 10 having a source terminal comprising a source region 12 with a metal source electrode 14 appended thereto, a drain terminal comprising a drain region 16 with a metal drain electrode 18 appended thereto, and a gate terminal comprising a gate layer 20 with a metal gate electrode 22 deposited thereon. The transistor 10 further comprises a substrate 24, a relatively thick layer 26 supported by the substrate 24, and a relatively thin layer 28 disposed between and contiguous to the thick layer 26 and the gate layer 20.

The substrate 24, the layers 26 and 28, and the gate 20 are all constructed of semiconductor compounds of group III and group V elements of the periodic table. Typical group III elements include aluminum, indium, and gallium. Typical group V elements include phosphorus, arsenic and antimony. In a preferred embodiment of the invention, the semiconductor compounds employed are, as shown in FIG. 1, gallium antimonide, and aluminum antimonide. The substrate 24 and the thin layer 28 are formed of high-resistivity gallium antimonide, while the thick layer 26 and the gate layer 20 are formed of aluminum antimonide. In an alternative embodiment of the invention, the aluminum antimonide is replaced with gallium-aluminum antimonide. Further, the substrate GaSb, whose purpose is to initiate epitaxy, can be replaced by other materials such as widely available GaAs and InP, or AlSb itself. In the case of AlSb, the epitaxial layer 26 would not be used. Although this disclosure emphasizes Group III-V compounds, the theory of the invention equally applies to other suitable semiconductors such as Group IV compounds and Group II-IV compounds.

Figure 2:
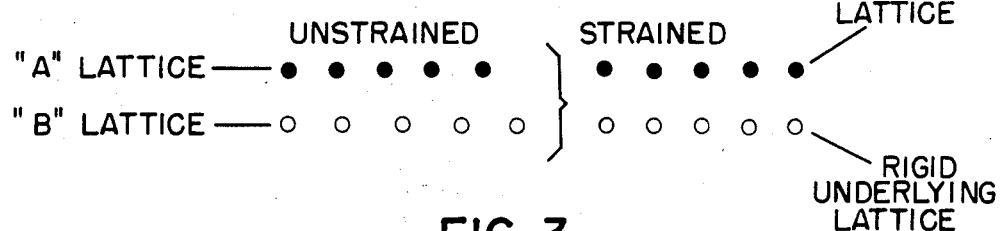
FIG. 2 demonstrates the straining of an epitaxial layer of the structure of FIG. 1.
Figure 3:
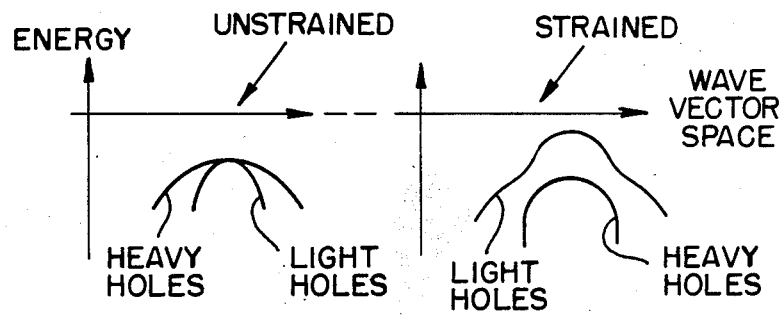
FIG. 3 is an energy level diagram showing strained and unstrained conditions of the structure of FIG. 1.
Figure 4:
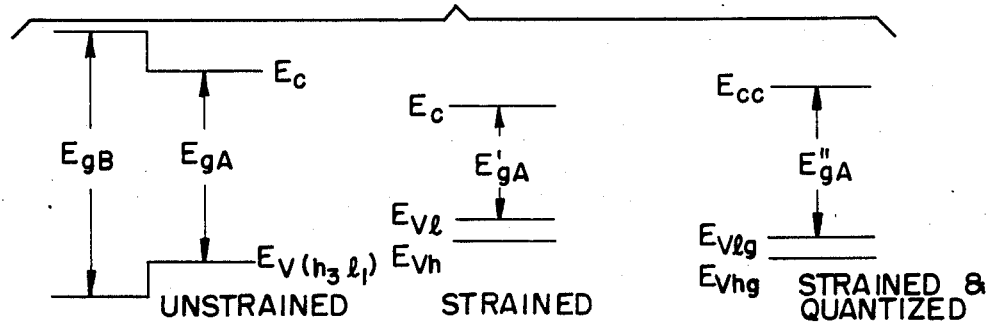
FIG. 4 is a set of energy level diagrams showing the effect of unstrained, the effect of strained, and the effect of strained plus the energy quantization with modulation doping.

With reference also to FIGS. 2, 3, and 4, the thick layer 26 is identified as layer "B" while the thin layer 28 is identified as layer "A". In the normal unstrained condition of the materials of the A and B layers, the crystalline lattice structure of layer A has a smaller spacing between lattice points than does the lattice of layer B.

In accordance with an important feature of the invention, the A layer is grown epitaxially upon layer B. Such epitaxial growth is performed, for example, by molecular beam epitaxy at a temperature of approximately 600° C. During the epitaxial growth, layer A develops with a lattice spacing equal to that of the B lattice spacing in the two dimensional layer plane as is demonstrated in FIG. 2. Layer B is sufficiently thick and rigid so as to stretch the material of the A lattice. This stretching results in a compression of the A lattice in the direction perpendicular to the plane, also illustrated in FIG. 2 along the surface at the interface between layers A and B.

It is noted that, with epitaxial growth, if the epitaxial layer were to be grown sufficiently thick, then the stresses generated would eventually be relaxed and the crystalline structure would gain the normal state and lattice spacing, thereby destroying the rigid relationship. However, in the construction of the invention, the thickness of the A layer is well below such upper limit on epitaxy so that the state of strain is retained. Such state of strain is retained independently of the presence of the gate layer 20. While the gate layer 20 is composed of the same material as is layer B, and therefore assists in the maintenance of the strained condition of A layer, its primary function is the provision of modulation doping for enhanced mobility of holes in a conduction channel 30 within the A layer between the source region 12 and the drain region 16.

In the cross-sectional view of FIG. 1, a preferred range of depths of the various layers of the transistor 10 are shown along the right-hand side of the figure. The substrate 24 has a conventional thickness, as is customarily employed in the construction of such semiconductor devices to provide a stable support for the active components of the device. A typical thickness of 5 mils is shown. The relatively thick layer 26 (layer B) has a thickness of approximately 5000 angstroms. The relatively thin layer 28 (layer A) has a thickness of approximately 100 angstroms. The gate layer 20 has a thickness in the range of 100-1000 angstroms, the relatively large range thickness being provided to accommodate differing operating voltage levels for the gate voltage $V_G$ relative to the source electrode 14 which is shown as being grounded. A thinner gate layer 20 is employed for lower gate voltages and a thicker gate layer 20 is employed for higher gate voltages.

The indicated thickness for layer A of approximately 100 angstroms is on the order of a few electron wavelengths with reference to the well-known quantum mechanics regime of semiconductor structures. With respect to energy levels of the charge carriers, particularly the holes, the aforementioned two-dimensional strain introduces a stress normal to the interface between the layers 26 and 28 which offsets the energy levels of the holes as depicted in FIG. 3. On the left side of the FIG. 3, there is shown the degenerate relationship of light holes and heavy holes in the unstrained condition of the gallium antimonide of the A layer. On the right-side of FIG. 3, there is shown the corresponding situation in the strained gallium antimonide wherein the degeneracy has been removed, and the light hole level has been elevated to a higher energy level with respect to that of the heavy hole. Such shift in the energy makes the light holes level the ground state which is occupied with holes providing a hole mobility which is sufficiently equal to the electron mobility in the well-known construction of n-type FET's so as to permit the construction of complementary circuits employing n-type and p-type FET's. The n-type FET is constructed in accordance with conventional technology, while the p-type FET embodies the invention and is constructed as disclosed herein.

The effect on the energy levels is further disclosed in FIG. 4 wherein on the left side of the figure there is portrayed the energy gap of the material of the B layer and in the material of the A layer when such material is in the unstrained condition. In FIG. 4, the energy is indicated by E, the gap is indicated by g, and the layers A and B identify the materials of the respective layers A and B. The energy gap is the difference between the conduction band edge and the valence band edge, the condition being indicated by the letter "C" and the valence being indicated by the letter "V".

In the center of FIG. 4, the effect of the strain is shown. The light and heavy holes are identified, respectively, by "L" and "H". The degenerate condition shown on the left side of FIG. 4, wherein both forms of holes occupy the same energy band, is changed under the strained condition wherein the light holes and the heavy holes occupy different energy levels. The energy levels are changed further, as shown on the right side of FIG. 4, by the effect of the aforementioned energy quantization and modulation doping. The impurities in the gate layer 20, release holes to the thin layer 28. But because the impurities are not present in the thin layer 28, the holes in layer 28 have high mobility and conductivity.

It is noted that such impurities may be placed in the gate layer 20 during epitaxial growth prior to the deposition of the metal gate electrode 22. In the presence of both the modulation doping and the application of a gate voltage between the gate and the source terminals, the foregoing hole conduction channel 30 as established within the layer 20 between the source region 12 and the drain region 16.

With respect to the construction of the device of FIG. 1, the entire structure can be achieved by molecular beam epitaxy or other suitable processes. Both the thick layer 26 and the thin layer 28 are undoped. Only the layer 20 is doped as mentioned above. The source region 12 and the drain region 16 are developed within the layer 28 by diffusion or by ionic implantation of impurities to produce the p+ state in each of these regions. That the source and drain regions may penetrate in the layer 26 is immaterial, because this layer is undoped, has a high resistivity and does not conduct current. The electrodes 14, 18 and 22 can be applied by conventional steps of metalization. Thus, it is appreciated that the device of the invention can be constructed by existing technological processes.

With respect to utilization of the transistor 10 in conventional electric circuits, the substrate 24 may be grounded if desired, and a drain voltage is applied between the drain electrode 18 and the source electrode 14. The aforementioned gate voltage is applied between the gate electrode 22 and the source electrode 14 or the drain electrode 16. Thus, the p-type transistor 10 can be connected in electric circuitry in a manner corresponding to that employed with conventional n-type FET's.

By way of summary, it is constructive to compare the operation of the semiconductor device of the invention with other semiconductor devices. In ordinary semiconductors, particularly III-V compounds, heavy holes have a large effective mass and a low mobility. Although light holes are present, electrical transport in p-type semiconductors is dominated by heavy holes which have a large density of states in bulk material and provide the ground state in heterostructures when energy quantization lifts a degeneracy at the valence band maximum. For this reason, fast transport devices, such as field-effect transistors invariably deal with electrons and n-type materials.

In the semiconductor device of the invention, there is a change in the roles played by the heavy holes and the light holes. This is accomplished by making the light hole dominant in population with the introduction of strain and stress. A stress normal to the interface between the layers 26 and 28 is accomplished by use of the lattice mismatch which is inherent in epitaxial heterostructures. Fast p-type devices can be realized by the light holes with their relatively small mass and relatively high mobility. These devices, while being important in their own right, can also be integrated with ordinary n-type electron devices for complementary circuits for logic and other applications.

The higher energy states available for light holes in the thin layer 28 can be occupied when holes are introduced by either ordinary doping or by modulation doping with p-type dopants. To take full advantage of carrier mobility enhancement by modulation doping, the holes are confined by a potential well to become two-dimensional in nature. Quantization of the energy levels by the modulation doping lowers the energies of all states with their magnitudes increasing with increasing confinement and decreasing mass.

The relative positions of the light and heavy holes depend in detail on the actual shape of the well. In a square well obtained by sandwiching the A layer between two B layers, accomplished by employing the same material in both the thick layer 26 and the gate layer 20, the potential is defined by the A layer thickness and the valence band discontinuities which are now different for the light and heavy holes. In a simple heterojunction, the potential is defined by the discontinuities and the space charge. It should be noted that the electrons states are also quantized, but this is not determinative of the hole energy levels of concern herein. Under proper conditions, the ground states of light holes corresponding to a quantization index $n=0$ remains the ground state of the system. As shown hereinabove, field-effect devices can then be readily accomplished by attaching source, drain and gate electrodes.

It is apparent that the fundamental requirement for operation of the structure of the invention is that there be a difference in the valance-band energy, Ev, of the two materials. Ev of the A layer is higher than Ev of the B layer. Furthermore, the lattice spacing in the B layer be greater than that in the A layer. These conditions are met in the GaSb - AlSb system wherein the reversal of the light and the heavy holes state occur. This condition is also met in the GaAs - GaAlAs system, although here the strain effect is relatively small.

With respect to the construction of electric circuitry including a p-type transistor of the invention in combination with a conventional n-type transistor of a group III-V compound, it is noted that such transistors may be fabricated as discrete components or may be constructed in an integrated circuit on a common substrate. In view of the fact that the construction steps utilized in fabricating the semiconductor structure of the invention are similar to those utilized in the construction of other semiconductor devices, it is apparent that by use of multiple epitaxial processes and diffusion and ion-implementation together with masking and photolithography, it is possible to construct an array of circuit elements including both p and n-type devices, particularly FET's with the n-type FET's being constructed in accordance with present day technology and the p-type FET's being constructed in accordance with the foregoing teachings.

It is to be understood that the above described embodiment of the invention is illustrative only and that modifications thereof may occur to those skilled in the art. Accordingly, this invention is not to be regarded to the embodiment disclosed herein but is to be limited only as defined by the appended claims.

Having thus described our invention, what we claims as new, and desire to secure by Letters Patent is:

1. A field-effect transistor comprising:
    a source terminal, a drain terminal, and a gate terminal;
    a first layer of semiconductor material comprising a first compound of a group III element with a group V element of the periodic table formed with a crystalline lattice structure having a first lattice spacing, said source terminal and said drain terminal being spaced apart from each other and in contact with said first layer, said gate terminal being spaced apart from said first layer;
    a second layer of semiconductor material comprising a second compound of a group III element with a group V element formed with a crystalline lattice structure having a second lattice spacing, said second layer extending between said source terminal and said drain terminal and being located between said first layer nd said gate terminal and electrically connected to said gate terminal; and wherein
    said second lattice spacing of said second compound in an unstressed state is less than said first lattice spacing of said first compound in an unstressed state, said second layer being formed by epitaxy as an epitaxial layer upon said first layer, the epitaxy straining said second compound to equalize said lattice spacings and introducing a stress which shifts an energy level of charge carriers for increased mobility of the charge carriers; and wherein the thickness of said first layer is at least approximately an order of magnitude greater than the thickness of said second layer to be sufficiently rigid for stressing said second layer, said second layer being sufficiently thin to retain the strain induced by the difference in lattice spacing, there being a conduction channel established in said second layer by modulation doping induced by said gate terminal.

2. A transistor according to claim 1 wherein said charge carriers are holes.

3. A transistor according to claim 1 further comprising a third semiconductor layer contiguous to said second semiconductor layer and disposed between said second layer and said gate terminal, said third layer being doped to induce said conduction channel for carriers in said second layer.

4. A transistor according to claim 3 wherein said third layer is doped with impurities to affect energy level states of said second layer and to provide said modulation doping.

5. A trasistor according to claim 4 wherein the lattice spacing of said second layer is less than the lattice spacing of said first layer, the strain being manifested as a two-dimensional stretching of said second layer along an interface with said first layer.

6. A transistor according to claim 5 wherein said first compound in said first layer is aluminum antimonide, and said second compound in said second layer is gallium antimonide.

7. A transistor according to claim 5 wherein said first compound of said first layer is gallium-aluminum antimonide and said second compound of said second layer is gallium antimonide.

8. A semiconductor device fabricated of a set of layers of semiconductor compounds of elements from groups III and V of the periodic table, and having a conduction channel for holes in one of said layers comprising:

a first layer of said set of layers formed of a first one of said compounds;

a second layer of said set of layers formed of a second of said compounds different from said first compound, the compounds in respective ones of said first and said second layers having crystalline structures with different lattice spacings, said conduction channel being located in said first layer;

a set of terminals electrically coupled to said conduction channel in said first layer; and wherein said first layer is constructed as an epitaxial layer upon said second layer, the difference in lattice spacing of said second layer from said first layer introducing a strain in said first layer during epitaxial growth of said first layer upon said second layer, said strain shifting energy levels of holes in said first layer to provide mobile holes in said conduction band; and wherein the thickness of said second layer is at least approximately an order of magnitude greater than the thickness of said first layer to be sufficiently rigid for stressing said first layer, said first layer being sufficiently thin to retain the strain induced by the difference in lattice spacing.

9. A device according to claim 8 wherein the lattice spacing of said first compound in said first layer is less than the lattice spacing of said second compound in said second layer, the strain being manifested as a two-dimensional stretching of said first layer along an interface between said first and said second layers, said strain being further manifested as a compression along a direction normal to said interface for shifting said energy levels.

10. A device according to claim 9 wherein said second layer has a thickness of approximately 5000 angstroms.

11. A device according to claim 10 wherein said first layer has a thickness in the range of 100 angstroms to 400 angstroms.

12. A device according to claim 11 further comprising a third layer of said set of layers, said third layer being located contiguous to said first layer on a side thereof opposite to said second layer, said third layer being doped with impurities to provide for modulation doping of said first layer.

* * * * *